(12) United States Patent
Loh et al.

(10) Patent No.: US 9,170,948 B2
(45) Date of Patent: Oct. 27, 2015

(54) CACHE COHERENCY USING DIE-STACKED MEMORY DEVICE WITH LOGIC DIE

(71) Applicants: Gabriel H. Loh, Bellevue, WA (US); Bradford M. Beckmann, Redmond, WA (US); Lisa R. Hsu, Kirkland, WA (US); Michael Ignatowski, Austin, TX (US); Michael J. Schulte, Austin, TX (US)

(72) Inventors: Gabriel H. Loh, Bellevue, WA (US); Bradford M. Beckmann, Redmond, WA (US); Lisa R. Hsu, Kirkland, WA (US); Michael Ignatowski, Austin, TX (US); Michael J. Schulte, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 259 days.

(21) Appl. No.: 13/726,146

(22) Filed: Dec. 23, 2012

(65) Prior Publication Data

US 2014/0181417 A1      Jun. 26, 2014

(51) Int. Cl.
*G06F 12/08* (2006.01)
*H01L 25/18* (2006.01)
*G11C 5/02* (2006.01)
*G11C 8/12* (2006.01)
*G11C 29/12* (2006.01)
*H01L 25/065* (2006.01)

(52) U.S. Cl.
CPC ............ *G06F 12/0828* (2013.01); *G11C 5/025* (2013.01); *G11C 8/12* (2013.01); *G11C 29/12* (2013.01); *H01L 25/0655* (2013.01); *H01L 25/18* (2013.01); *H01L 25/0657* (2013.01); *H01L 2224/16225* (2013.01); *H01L 2225/06541* (2013.01); *H01L 2225/06565* (2013.01); *H01L 2924/1461* (2013.01); *H01L 2924/15311* (2013.01); *Y02B 60/1225* (2013.01)

(58) Field of Classification Search
CPC ............ G06F 12/0246; G06F 12/0815; G06F 12/0828; G06F 12/084
See application file for complete search history.

(56) References Cited

U.S. PATENT DOCUMENTS

| | | |
|---|---|---|
| 6,189,065 B1 | 2/2001 | Arndt et al. |
| 6,519,674 B1 | 2/2003 | Lam et al. |
| 7,477,535 B2 | 1/2009 | Lahtinen et al. |
| 7,796,446 B2 | 9/2010 | Ruckerbauer et al. |
| 7,930,661 B1 | 4/2011 | Trimberger et al. |
| 8,233,303 B2 | 7/2012 | Best et al. |
| 8,356,138 B1 | 1/2013 | Kulkarni et al. |

(Continued)

OTHER PUBLICATIONS

International Search Report and Written Opinion correlating to PCT/US13/075956 dated May 9, 2014, 13 pages.
Non-Final Office Action mailed May 14, 2014 for U.S. Appl. No. 13/726,145, 23 pages.
Non-Final Office Action mailed Jun. 20, 2014 for U.S. Appl. No. 13/567,945, 31 pages.

(Continued)

*Primary Examiner* — Hiep Nguyen

(57) ABSTRACT

A die-stacked memory device implements an integrated coherency manager to offload cache coherency protocol operations for the devices of a processing system. The die-stacked memory device includes a set of one or more stacked memory dies and a set of one or more logic dies. The one or more logic dies implement hardware logic providing a memory interface and the coherency manager. The memory interface operates to perform memory accesses in response to memory access requests from the coherency manager and the one or more external devices. The coherency manager comprises logic to perform coherency operations for shared data stored at the stacked memory dies. Due to the integration of the logic dies and the memory dies, the coherency manager can access shared data stored in the memory dies and perform related coherency operations with higher bandwidth and lower latency and power consumption compared to the external devices.

26 Claims, 5 Drawing Sheets

(56) References Cited

U.S. PATENT DOCUMENTS

| | | | |
|---|---|---|---|
| 8,423,789 | B1 | 4/2013 | Poo et al. |
| 8,451,014 | B2 | 5/2013 | Black et al. |
| 8,519,739 | B1 | 8/2013 | Leon |
| 8,546,955 | B1 | 10/2013 | Wu |
| 8,700,951 | B1 | 4/2014 | Call et al. |
| 8,778,734 | B2 | 7/2014 | Metsis |
| 2004/0153902 | A1 | 8/2004 | Machado et al. |
| 2006/0164882 | A1 | 7/2006 | Norman |
| 2008/0066302 | A1 | 3/2008 | Chung |
| 2008/0320346 | A1 | 12/2008 | Lin |
| 2009/0017580 | A1 | 1/2009 | Smith |
| 2009/0055596 | A1 | 2/2009 | Wallach et al. |
| 2009/0103345 | A1* | 4/2009 | McLaren et al. ............... 365/64 |
| 2009/0190404 | A1 | 7/2009 | Roohparvar |
| 2009/0313483 | A1 | 12/2009 | Ranade |
| 2010/0005118 | A1 | 1/2010 | Sezer |
| 2010/0008058 | A1 | 1/2010 | Saen et al. |
| 2010/0070696 | A1 | 3/2010 | Blankenship |
| 2010/0070782 | A1 | 3/2010 | Majewski et al. |
| 2010/0157644 | A1* | 6/2010 | Norman ............... 365/51 |
| 2010/0161918 | A1 | 6/2010 | Norman |
| 2010/0167100 | A1 | 7/2010 | Moore et al. |
| 2011/0231739 | A1 | 9/2011 | Kim |
| 2012/0023376 | A1 | 1/2012 | Jeddeloh |
| 2012/0079176 | A1 | 3/2012 | Sun et al. |
| 2012/0104578 | A1 | 5/2012 | Hu et al. |
| 2012/0130983 | A1 | 5/2012 | Ryan et al. |
| 2012/0204073 | A1 | 8/2012 | Whetsel |
| 2012/0273782 | A1 | 11/2012 | Goel et al. |
| 2012/0290793 | A1 | 11/2012 | Chung et al. |
| 2013/0031330 | A1 | 1/2013 | Jones et al. |
| 2013/0042060 | A1 | 2/2013 | Marukame et al. |
| 2013/0086353 | A1 | 4/2013 | Colgrove et al. |
| 2013/0257481 | A1 | 10/2013 | Metsis |
| 2013/0292840 | A1 | 11/2013 | Shoemaker et al. |
| 2014/0013169 | A1 | 1/2014 | Kobla et al. |
| 2014/0085959 | A1* | 3/2014 | Saraswat et al. ............... 365/63 |
| 2014/0108891 | A1 | 4/2014 | Strasser et al. |
| 2014/0173113 | A1* | 6/2014 | Vemuri et al. ............... 709/226 |

OTHER PUBLICATIONS

Nathan Brookwood, "AMD Fusion Family of APUs: Enabling a Superior, Immersive PC Experience", AMD White Paper: AMD Fusion Family of APUs, Mar. 2010, 8 pages.
"How Computers Work: The CPU and Memory", <http://homepage.cs.url.edu/faculty/wolfe/book/Readings/Reading04.htm> Feb. 1, 2002, 1 page.
N. S. Matlo, "Introduction to Microcoded Implementation of a CPU Architecture", <http://www.cs.ucsb.edu/~chong/154/Tan.pdf> Jan. 21, 1997, 12 pages.
Lixin Tao, "Interrupt Processing", <http://csis.pace.edu/~lixin/teaching/cs371/interrupt.pdf> Sep. 2002, 3 pages.
Shawn Hargreaves, "An elf in a box", <http://blogs.msdn.com/b/shawnhar/archive/2008/03/31/an-elf-in-a-box.aspx> Mar. 31, 2008, 5 pages.
Chris Rawson, "Mac 101: Integrated versus discrete graphics", <http://www.tuaw.com/2010/05/14/mac-101-integrated-versus-discrete-graphics/> May 14, 2010, 2 pages.
Matthew Hogan, "Silicon Interposers: building blocks for 3D-Ics", <http://electroiq.com/blog/2011/06/silicon-interposers-building-blocks-for-3d-ics/> Jun. 14, 2011, 6 pages.
Nigel Jacob, "Offloading IDS Computation to the GPU", 22nd Annual Computer Security Applications Conference (ACSAC'06), <http://www.acsac.org/2006/papers/74.pdf> Dec. 21, 2006, 10 pages.
Laura Tiffany, "How Many Computer Processors Do You Need?" <http://www.allbusiness.com/computing-information-technology/parallel-computing/12603535-1/html> Aug. 7, 2009, 2 pages.
QNX "Processes and Threads", <http://www.qnx.com/developers/docs/6.4.0/neutrino/getting_started/s1_procs.html> May 29, 2009, 20 pages.
Eric Chan, "GPU Gems 2" <http://http.developer.nvidia.com/GPUGems2_chapter22.html> Apr. 15, 2005, Chapter 22, 11 pages.
Yi Yang et al. "CPU-assisted GPGPU on fused CPU-GPU architectures", IEEE, Feb. 2012, 12 pages.
Debra Cook et al. "Secret Key Cryptography Using Graphics Cards", Columbia University Technical Report, Jan. 14, 2004, 14 pages.
Matthew Hogan et al. "Robust Verification of 3D-Ics: Pros, Cons and Recommendations", IEEE, Aug. 21, 2009, 6 pages.
Carlos Carvalho, "The Gap Between Processor and Memory Speeds", ICCA, 2002, 8 pages.
Christianto C. Liu et al. "Bridging the Processor-Memory Performance Gap with 3D IC Technology", IEEE vol. 22, Issue 6, Nov. 21, 2005, 9 pages.
Jon Stokes "Ask Ars: what is a CPU thread?" Ministry of Innovation of Technology, Apr. 12, 2011, 2 pages.
"Computer-System Operation", <http://siber.cankaya.edu.tr/operatingsystems/ceng328/node15.html> Feb. 14, 2011, 4 pages.
Non-Final Office Action mailed Dec. 20, 2013 for U.S. Appl. No. 13/567,945, 13 pages.
Non-Final Office Action mailed Feb. 27, 2014 for U.S. Appl. No. 13/567,958, 24 pages.
U.S. Appl. No. 13/328,393, filed Dec. 16, 2011, entitled "Memory Architecture for Read-Modify-Write Operations".
U.S. Appl. No. 13/567,945, filed Aug. 6, 2012, entitled "Stacked Memory Device With Metadata Mangement".
U.S. Appl. No. 13/567,958, filed Aug. 6, 2012, entitled "Stacked Memory Device With Helper Processor".
U.S. Appl. No. 13/726,142, filed Dec. 23, 2012, entitled "Die-Stacked Device With Partitioned Multi-Hop Network".
U.S. Appl. No. 13/726,143, filed Dec. 23, 2012, entitled "Die-Stacked Memory Device Providing Data Translation".
U.S. Appl. No. 13/726,144, filed Dec. 23, 2012, entitled "Quality of Service Support Using Stacked Memory Device With Logic Die".
U.S. Appl. No. 13/726,145, filed Dec. 23, 2012, entitled "Die-Stacked Memory Device With Reconfigurable Logic".
David Patterson et al., "FP 14.1: Intelligent Ram (IRAM): Chips That Remember & Compute", 1997 IEEE International Solid-State Circuits Conference, Feb. 7, 1997, 2 pages.
Gabriel H. Loh, "3D-Stacked Memory Architectures for Multi-Core Processors", ISCA '08 Proceedings of the 35th Annual International Symposium on Computer Architecture, Jun. 2008, pp. 453-464.
J. Thomas Pawlowski, " Hybrid Memory Cube (HMC)", Micron Technologies, Aug. 4, 2011, 24 pages.
Intel Platform Brief "Intel Atom Processor E6x5C Series-Based Platform for Embedded Computing", http://newsroom.intel.com/servlet/jiveservlet/download/1512-31-3257/ProductBrief-IntelAtomProcessor_E600C_series_v2.pdf, Jan. 2010, 4 pages.
Stretch, Inc. Configurable Processors, http://www.stretchinc.com, Accessed Apr. 2, 2013, 1 page.
Non-Final Office Action mailed Nov. 7, 2014 for U.S. Appl. No. 13/726,142, 20 pages.
Final Office Action mailed Oct. 31, 2014 for U.S. Appl. No. 13/567,945, 23 pages.
Final Office Action mailed Aug. 11, 2014 for U.S. Appl. No. 13/567,958, 27 pages.
Notice of Allowance mailed Aug. 25, 2014 for U.S. Appl. No. 13/726,145, 22 pages.
International Search Report and Written Opinion correlating to PCT/US2013/053599 dated Dec. 9, 2013, 8 pages.
International Search Report and Written Opinion correlating to PCT/US2013/053596 dated Dec. 9, 2013, 8 pages.
NPL Non-Final Office Action mailed Jan. 15, 2015 for U.S. Appl. No. 13/941,791, 33 pages.
U.S. Appl. No. 14/551,147, filed Nov. 24, 2014, entitled "Die-Stacked Memory Device With Reconfigurable Logic".
Non-Final Office Action mailed Dec. 17, 2014 for U.S. Appl. No. 13/726,143, 13 pages.
Non-Final Office Action mailed Dec. 22, 2014 for U.S. Appl. No. 13/726,144, 14 pages.

* cited by examiner

CACHE COHERENCY USING DIE-STACKED MEMORY DEVICE WITH LOGIC DIE

BACKGROUND

1. Field of the Disclosure

The present disclosure generally relates to processing systems and, more particularly, to cache coherency in processing systems.

2. Description of the Related Art

Processing systems generally implement system memory as a device separate from the devices implementing processors, input/output (I/O) components, and other components. Such systems therefore are often bandwidth-limited due to the volume of traffic on the interconnect connecting the system memory to the other components and latency-limited due to the propagation delay of the signaling traversing the relatively-long interconnect and the handshaking process needed to conduct such signaling. The inter-device bandwidth and inter-device latency have a particular impact on processing efficiency and power consumption of the system when a performed task requires multiple accesses to system memory, as each access requires a back-and-forth communication between the system memory and the requesting device and thus the inter-device bandwidth and latency penalties are incurred twice for each access. This problem is exacerbated in processing systems implementing cache coherency protocols for shared memory, as the processor-initiated coherency operations implemented in conventional cache coherency protocols typically make relatively heavy use of the memory interconnect and thus are significant sources of decreased memory interconnect bandwidth and increased memory interconnect latency.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION OF PREFERRED EMBODIMENTS

FIGS. 1-7 illustrate example techniques for improved processing efficiency and decreased power consumption in a processing system through the use of a die-stacked memory device implementing an integrated coherency manager to offload some or all cache coherency protocol operations for memory addresses or memory address ranges mapped to the memory cell circuitry of the die-stacked memory device. The die-stacked memory device includes a set of one or more stacked memory dies and a set of one or more logic dies. The one or more logic dies implement hardware logic for a memory interface and the coherency manager. The memory interface is coupled to the memory cell circuitry and is coupleable to one or more devices external to the die-stacked memory device. The memory interface operates to perform memory accesses in response to memory access requests from both the coherency manager and the one or more external devices. The coherency manager comprises logic to perform one or more coherency operations for shared data stored at the one or more stacked memory dies. Due to the coherency manager's tight integration with the memory dies, the coherency manager can access shared data stored in the memory dies and perform related coherency operations with higher bandwidth and lower latency and power consumption compared to the external devices. Moreover, the offloading of coherency operations to the die-stacked memory device permits the external devices to perform other tasks focusing on program execution, thereby increasing the overall processing throughput of the system.

For ease of illustration, example techniques are described in the context of invalidation-based cache coherency protocols that wait for invalidation acknowledgements before write operations complete. However, using the guidelines provided herein, the techniques may be similarly implemented for update-based cache coherency protocols that push updates to the devices sharing the corresponding memory resource. Example cache coherency protocols that may be implemented include one or a combination of the Modified-Shared-Exclusive-Invalid (MESI) protocol (also referred to as the Illinois protocol), the Modified-Owned-Exclusive-Shared-Invalid (MOESI) protocol, the write-once, or Goodman, protocol, the Berkeley protocol, the Firefly protocol, the Directory Architecture for sHared Memory (DASH) protocol, and the like.

Figure 1:
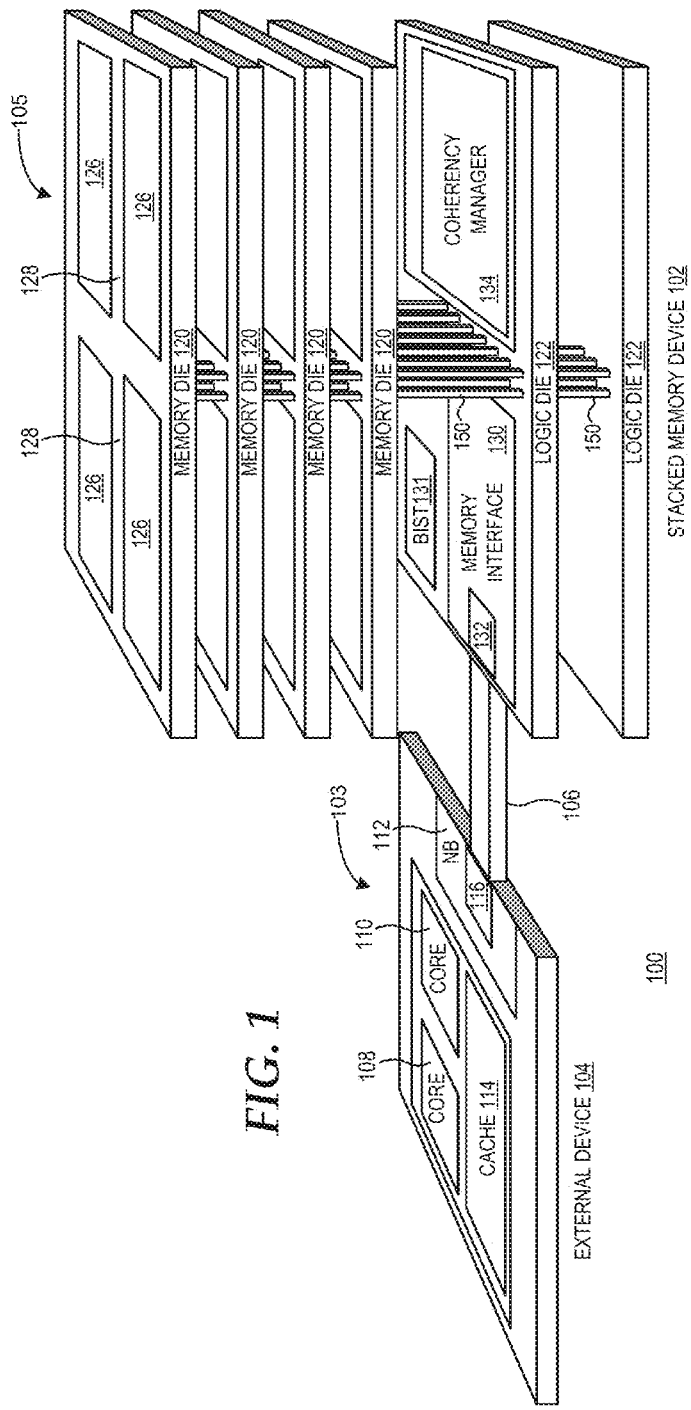
FIG. 1 is a diagram illustrating an exploded perspective view of a vertical-stack configuration of a processing system implementing a die-stacked memory device with a logic die implementing a hardware coherency manager to facilitate cache coherency in accordance with some embodiments.

FIG. 1 illustrates a processing system 100 in accordance with some embodiments. The processing system 100 can comprise any of a variety of computing systems, including a notebook or tablet computer, a desktop computer, a server, a network router, switch, or hub, a computing-enabled cellular phone, a personal digital assistant, and the like. In the depicted example, the processing system 100 includes a die-stacked memory device 102 and at least one external device 104 coupled via an inter-device interconnect 106. While the processing system 100 typically includes multiple external devices 104 coupled to the die-stacked memory device 102 via the interconnect 106, FIG. 1 depicts a single external device for ease of illustration. The processing system 100 also can include a variety of other components not illustrated in FIG. 1, such as one or more display components, storage devices, input devices (e.g., a mouse or keyboard), and the like. In some embodiments, the one or more external devices 104 are implemented separately or in combination as one or more integrated circuit (IC) packages 103 and the die-stacked memory device 102 is implemented as an IC package 105 separate from the IC packages 103 implementing the one or more external devices 104. In some embodiments, some or all of the external devices 104 and the die-stacked memory device 102 are implemented as separate sets of dies connected via an interposer in the same IC package. In either instance, the term "external device," as used herein, refers to a device external to the die-stacked memory device 102.

In the illustrated example, the external device 104 is depicted as a processor, and is thus also referred to herein as "processor 104." External devices can include other types of devices, such as input/output (I/O) controllers. In this example, the processor 104 comprises one or more processor cores, such as processor cores 108 and 110, a northbridge 112, one or more caches 114 (e.g., a L1 cache, a L2 cache, etc.), and various peripheral components (not shown). The processor cores 108 and 110 can include any of a variety of processor cores and combinations thereof, such as a central processing unit (CPU) core a graphics processing unit (GPU), a digital signal processor (DSP), and the like. The peripheral components can include, for example, an integrated southbridge or input/output controller, and the like. The northbridge 112 includes, or is associated with, a memory controller interface 116 comprising a physical interface (PHY) connected to the conductors of the interconnect 106.

The interconnect 106 can be implemented in accordance with any of a variety of conventional interconnect or bus architectures, such as a Peripheral Component Interconnect-Express (PCI-E) architecture, a HyperTransport architecture, a QuickPath Interconnect (QPI) architecture, and the like. Alternatively, the interconnect 106 can be implemented in accordance with a proprietary bus architecture. The interconnect 106 includes a plurality of conductors coupling transmit/receive circuitry of the memory interface 116 of the external device 104 with the transmit/receive circuitry of the memory interface 130 of the die-stacked memory device 102. The conductors can include electrical conductors, such as printed circuit board (PCB) traces or cable wires, optical conductors, such as optical fiber, or a combination thereof.

The die-stacked memory device 102 may implement any of a variety of memory cell architectures, including, but not limited to, volatile memory architectures such as dynamic random access memory (DRAM) and static random access memory (SRAM), or non-volatile memory architectures, such as read-only memory (ROM), flash memory, ferroelectric RAM (F-RAM), magnetoresistive RAM, and the like. For ease of illustration, the example implementations of the die-stacked memory device 102 are described herein in the example, non-limiting context of a DRAM architecture.

As illustrated by the exploded perspective view of FIG. 1, the die-stacked memory device 102 comprises a set of one or more stacked memory dies 120 and a set of one or more logic dies 122. Each memory die 120 comprises memory cell circuitry 126 implementing bitcells in accordance with the memory architecture of the die-stacked memory device 102 and the peripheral logic circuitry 128 implements the logic and other circuitry to support access and maintenance of the bitcells in accordance with this memory architecture. To illustrate, DRAM typically is composed of a number of ranks, each rank comprising a plurality of banks, and each bank comprising a matrix of bitcells set out in rows and columns. Accordingly, some embodiments, each memory die 120 may implement one rank (and thus the banks of bitcells for the corresponding rank). In another embodiment, the DRAM ranks each may be implemented across multiple memory dies 120. For example, the die-stacked memory device 102 may implement four ranks, each rank implemented at a corresponding quadrant of each of the memory dies 120. In either implementation, to support the access and maintenance of the DRAM bit cells, the peripheral logic circuitry 128 may include, for example, line drivers, bitline/wordline precharging circuitry, refresh circuitry, row decoders, column select logic, row buffers, sense amplifiers, and the like.

The one or more logic dies 122 implement hardware logic to facilitate access to the memory of the die-stacked memory device 102. This logic includes, for example, the memory interface 130, built-in self test (BIST) logic 131, and the like. The memory interface 130 can include, for example, receivers and line drivers, memory request buffers, scheduling logic, row/column decode logic, refresh logic, data-in and data-out buffers, clock generators, and the like. Although the illustrated embodiment depicts a memory controller 116 implemented at the processor 104, in other embodiments, a memory controller instead may be implemented at the memory interface 130. The memory interface 130 further comprises a bus interface 132 comprising a PHY coupleable to the conductors of the interconnect 106, and thus coupleable to the external devices of the processing system 100.

In addition to implementing logic to facilitate access to the memory implemented by the memory dies 120, one or more logic dies 122 implement a coherency manager 134 to partially or fully implement a cache coherency protocol for memory addresses or memory address ranges mapped to the memory cell circuitry 126 for the benefit of the external devices of the processing system 100. The coherency manager 134 is coupled to the memory interface 130 and comprises logic to perform one or more coherency operations. The coherency manager 134 may include storage elements (e.g., registers, caches, or content addressable memories) located at one or more of the logic dies 122 to store cache coherency-related information (hereinafter, "coherency information"), the memory cell circuitry 126 may store the coherency information, or some portions of the coherency information may be stored in the storage elements of the logic dies 122 while other portions are stored in the memory cell circuitry 126. Further, in some embodiments, the coherency manager 134 can employ a non-volatile memory (NVM), such as flash memory, at a logic die 122 or in a memory die 120, to retain certain coherency information after a power-down event.

In the illustrated example, the coherency manager 134 and the memory interface 130 are implemented on the same logic die 122. In some embodiments, the memory interface 130 and the coherency manager 134 may be implemented on different logic dies. For example, the memory interface 130 may be implemented at one logic die 122 and the coherency manager 134 may be implemented at another logic die 122. In some embodiments, one or both of the memory interface 130 and the coherency manager 134 may be implemented across multiple logic dies. To illustrate, the memory interface 130 and the logic circuitry of the coherency manager 134 may be implemented at one logic die 122 and certain storage elements of the coherency manager 134 (e.g., a cache or content addressable memory) may be implemented at another logic die 122.

One or more logic dies 122 further may implement operation logic (not shown) to perform data manipulation operations using the data stored in the stacked memory dies 120. These data manipulation operations typically take advantage of the high-bandwidth, low-latency connection between the logic dies 122 and the memory dies 120 to efficiently manipulate the data in a manner that reduces or eliminates the snoop traffic on the interconnect 106 that otherwise would have been necessary had the data manipulation operation been performed by an external device. Examples include, for example, pointer-following operations, encryption operations, search operations, and the like. As the correct performance of certain data manipulation operations may rely on the manipulated data being coherent, the coherency manager 134 can be used to efficiently achieve this coherency for the data before the operation logic performs the data manipulation operation.

In the depicted implementation of FIG. 1, the die-stacked memory device 102 is implemented in a vertical stacking arrangement whereby power and signaling are transmitted between the logic dies 122 and the memory dies 120 using dense through silicon vias (TSVs) 150 or other vertical interconnects. Although FIG. 1 depicts the TSVs 150 in a set of centralized rows, the TSVs 150 instead may be more dispersed across the floorplans of the dies. Note that FIG. 1 provides an exploded-view representation of the dies 120 and 122 to permit illustration of the TSVs 150 and the components of the dies 120 and 122. In implementation, each of the dies overlies and is in contact with the preceding die. In some embodiments, the coherency manager 134 accesses with the memory implemented at the memory dies 120 directly via the TSVs 150 (that is, the coherency manager 134 implements its own memory controller). In another embodiment, the memory interface 130 controls access to the TSVs 150 and thus the coherency manager 134 accesses the memory dies 120 through the memory interface 130.

The die-stacked memory device 102 may be fabricated using any of a variety of 3D integrated circuit fabrication processes. In one approach, the dies 120 and 122 each are implemented as a separate substrate (e.g., bulk silicon) with active devices and one or more metal routing layers formed at an active surface. This approach can include a wafer-on-wafer process whereby a wafer comprising a matrix of dice is fabricated and thinned, and TSVs are etched through the bulk silicon. Multiple wafers are then stacked to achieve the illustrated layer configuration (e.g., a stack of four wafers comprising memory circuitry dies for the four memory dies 120 and a wafer comprising the logic die for the logic die 122), aligned, and then joined via thermocompression. The resulting stacked wafer set is singulated to separate the individual 3D IC devices, which are then packaged. In a die-on-die process, the wafer implementing each corresponding die is first singulated, and then the dies are separately stacked and joined to fabricate the 3D IC devices. In a die-on-wafer approach, wafers for one or more layers are singulated to generate the dies for one or more layers, and these dice are then aligned and bonded to the corresponding die areas of another wafer, which is then singulated to produce the individual 3D IC devices. One benefit of fabricating the dies 120 and 122 as dice on separate wafers is that a different fabrication process can be used to fabricate the logic dies 122 than that used to fabricate the memory dies 120. Thus, a fabrication process that provides improved performance and lower power consumption may be used to fabricate the logic dies 122 (and thus provide faster and lower-power interface logic and circuitry for the coherency manager 134), whereas a fabrication process that provides improved cell density and improved leakage control may be used to fabricate the memory dies 120 (and thus provide more dense, lower-leakage bitcells for the stacked memory).

In another approach, the dies 120 and 122 are fabricated using a monolithic 3D fabrication process whereby a single substrate is used and each die is formed on a preceding die using a layer transfer process, such as an ion-cut process. The die-stacked memory device 102 also may be fabricated using a combination of techniques. For example, the logic dies 122 may be fabricated using a monolithic 3D technique, the memory dies may be fabricated using a die-on-die or wafer-on-wafer technique, or vice versa, and the resulting logic die stack and memory die stack then may be bonded to form the 3D IC device for the die-stacked memory device 102.

Figure 2:
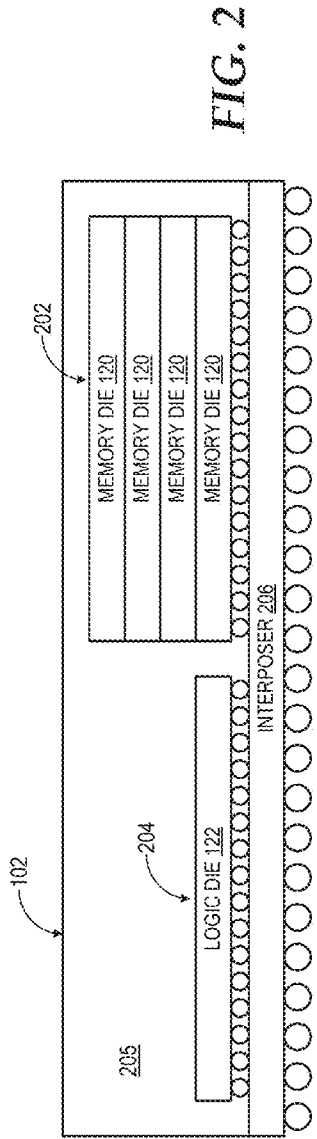
FIG. 2 is a diagram illustrating a cross-section view of a side-split configuration of the processing system of FIG. 1 in accordance with some embodiments.

FIG. 2 illustrates a cross-section view of an alternative implementation of the die-stacked memory device 102 in accordance with another embodiment of the present disclosure. Rather than implement a vertical stack implementation as shown in FIG. 1 whereby the one or more logic dies 122 are vertically aligned with one or more memory dies 120, the die-stacked memory device 102 instead may implement the side-split arrangement of FIG. 2 whereby the one or more memory dies 120 are implemented as an IC device 202 and the one or more logic dies 122 are implemented as a separate IC device 204, and the IC devices 202 and 204 (and thus the logic dies 122 and the memory dies 120) are connected via an interposer 206. In this arrangement, the one or more memory dies 120 are "stacked" horizontally relative to the one or more logic dies 122. The interposer 206 can comprise, for example, one or more levels of silicon interposers, a printed circuit board (PCB), or a combination thereof. Although FIG. 2 illustrates the stacked memory dies 120 together implemented as a single IC device 202, the stacked memory dies 120 instead may be implemented as multiple IC devices 202, with each IC device 202 comprising one or more memory dies 120. Likewise, the logic dies 122 may be implemented as a single IC device 204 or as multiple IC devices 204. The one or more IC devices 202, the one or more IC devices 204, and the unifying interposer 206 are packaged as an IC package 205 representing the die-stacked memory device 102.

Figure 3:
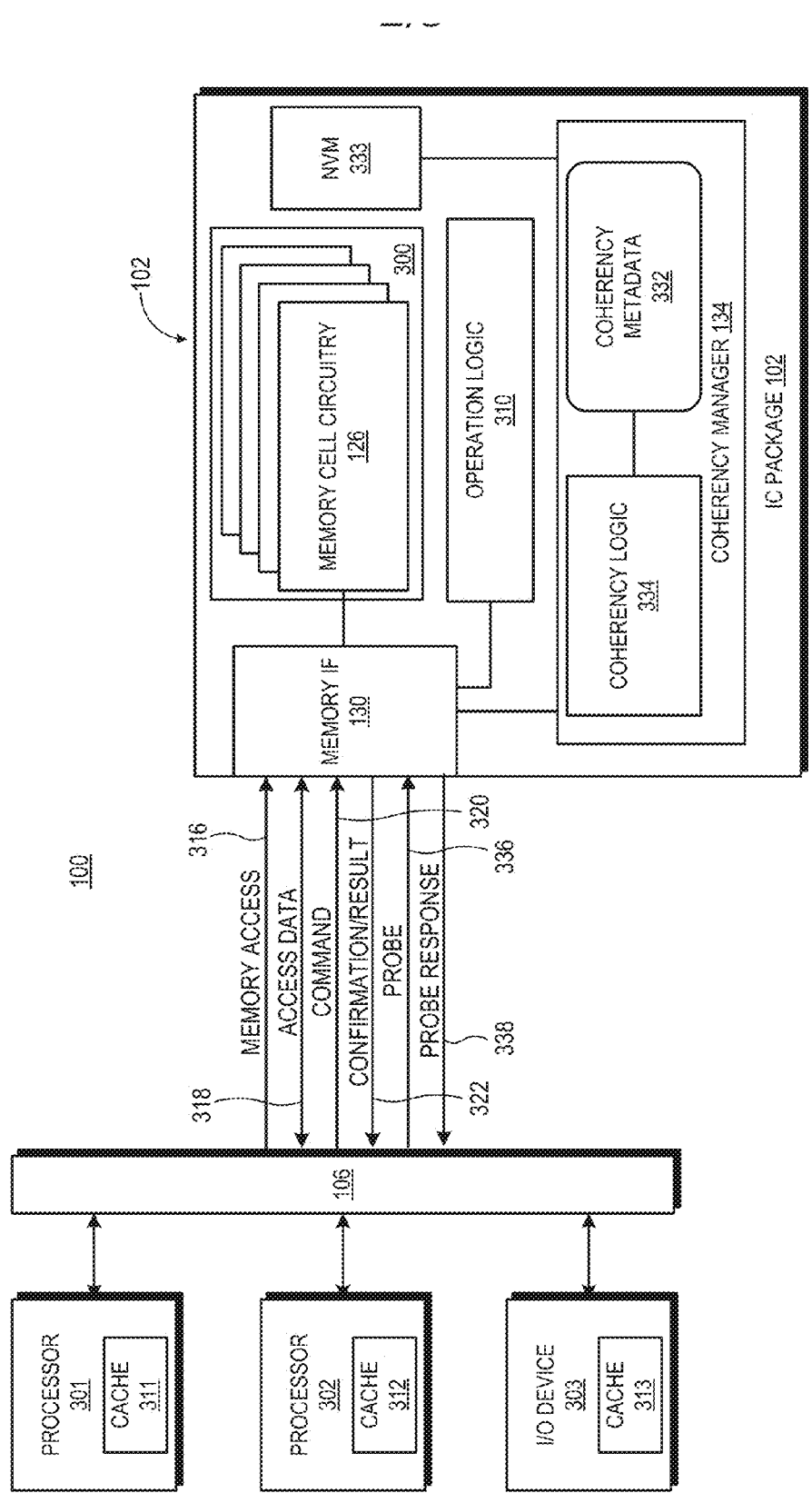
FIG. 3 is a block diagram illustrating the processing system of FIG. 1 in greater detail in accordance with some embodiments.

FIG. 3 illustrates the processing system 100 in block diagram form in accordance with some embodiments. In this example, the processing system 100 includes multiple external devices, in the form of processors 301 and 302 and I/O controller 303, coupled to the die-stacked memory device 102 via the interconnect 106. For ease of reference, the processors 301 and 302 and I/O controller 303 are referred to herein collectively as "external devices 301-303". In some embodiments, the interconnect 106 operates as both a memory data interconnect and a coherency interconnect in that both data and coherency protocol transactions are communicated among the external devices and the stacked memory via the interconnect 106. In other embodiments, the interconnect 106 operates as the memory data interconnect and a separate interconnect is implemented for coherency protocol transactions. In yet other embodiments, multiple interconnects may be used to connect the external devices and the die-stacked memory device 102. For example, the processors 301, 302, and the I/O controller 303 each may have their own dedicated bus or point-to-point interconnect to connect to the die-stacked memory device 102.

The die-stacked memory device 102 implements a stacked memory 300 represented by multiple stacked dies of memory cell circuitry 126. The stacked memory 300 is operated as a shared memory resource for the external devices 301-303 such that the external devices 301-303 share a global memory address space, at least part of which has memory addresses or one or more memory address ranges that map to memory blocks of the memory cell circuitry 126. Further, the external devices 301-303 utilize a memory hierarchy whereby local copies of certain operands and other data are stored at one or more local cache levels. For example, the processor 301, the processor 302, and the I/O controller 303 may implement a cache 311, a cache 312, and a cache 313, respectively, to store copies of data mapped to memory addresses associated with the die-stacked memory device 102.

In operation, the die-stacked memory device 102 functions as a conventional system memory for storing data on behalf of other system components. In a conventional memory access operation, an external device issues a memory access request 316 by manipulating the PHY of its memory interface 116 (FIG. 1) to transmit address signaling and, if the requested memory access is a write access, data signaling via the interconnect 106 to the die-stacked memory device 102. The PHY of the memory interface 130 receives the signaling, buffers the memory access request represented by the signaling, and then accesses the memory cell circuitry 126 to fulfill the requested memory access. In the event that the memory access request 316 is a write access, the memory interface 130 stores the signaled operational data to the location of the stacked memory 300 indicated by the signaled address. In the event that the memory access request 316 is a read request, the memory interface 130 accesses the requested operational data from the location of the stacked memory 300 corresponding to the signaled address and manipulates the PHY of the memory interface 130 to transmit signaling representative of the accessed data 318 to the requesting external device via the interconnect 106.

Moreover, the die-stacked memory device 102 also functions to offload certain data manipulation operations from the external devices of the processing system 100. These data manipulation operations typically leverage the tight integration between the logic dies 122 and the stacked memory dies 120 so as to efficiently manipulate the data stored in the stacked memory 300 without involving substantial back-and-forth signaling via the interconnect 106, thereby freeing the bandwidth of the interconnect 106 for other uses. Such data manipulation operations can include, but are not limited to, searches, gather/scatter operations, pointer chasing operations, compression, encryption, erasing blocks of memory, and execution of embedded programs (e.g., interrupt handling routines) via an embedded processor in the logic dies. To this end, the one or more logic dies 122 may implement one or more instances of operation logic 310 to perform the data manipulation operations. The operation logic 310 may be implemented as hardcoded or hardwired logic, as an embedded processor executing software/firmware, or combinations thereof. Examples of the operation logic 310 and corresponding data manipulation operations are described in co-pending U.S. patent application Ser. No. 13/567,945 and co-pending U.S. patent application Ser. No. 13/567,958, the entireties of which are incorporated by reference herein.

In some instances, data manipulation operations performed by the die-stacked memory device 102 are initiated in response to a memory access request 316 or in response to an operation command 320 issued by an external device. For example, the operation logic 310 may be configured to support a mark-and-sweep function for a garbage collection process, and the external device can direct the die-stacked memory device 102 to mark an object at address X as reachable by issuing an operation command 320 in the form of a "MARK(X)" command, in response to which the operation logic 310 writes a specified value (e.g., a "1") to a status bit associated with the data stored at address X. The operation logic 310 can provide a response 322 to the operation command 320 issued by the external device, whereby the response 322 can include, for example, a confirmation that the operation command 320 has been received and carried out, or a result of the performance of the data manipulation operation represented by the operation command 320.

Certain data manipulation operations may be software-invisible or background operations run independent of the external device 104. Accordingly, in other instances, data manipulation operations may be initiated by the die-stacked memory device 102 independent of memory access requests 316, operation commands 320, or other signaling from the external devices. To illustrate, the operation logic 310 may be configured to periodically scan through the data stored at the stacked memory 300 and the corresponding ECC values to identify and correct data that was corrupted due to a soft error or a malfunction of the memory cell circuitry 126.

Regardless of the event initiating a data manipulation operation, correct operation of the data manipulation operation often requires that the involved data be up-to-date, or "coherent"; that is, the data stored in the stacked memory 300 and manipulated during the data manipulation operation reflects the most recent version of that data. In some embodiments, the device requesting the data manipulation operation performs the coherency operations needed to ensure that the changes to local versions of the data made by the external devices are propagated to the die-stacked memory device 102 before the requesting external device sends the operation command 320 to the die-stacked memory device 102. However, this processor-initiated coherency update approach can unnecessarily consume processor resources and result in unnecessary or inopportune coherency snoop traffic on the interconnect 106.

Accordingly, in some embodiments, the cache coherency protocol of the processing system 100 is at least partially implemented by the die-stacked memory device 102. As part of this support of the cache coherency protocol, the coherency manager 134 may store various coherency metadata in one or more storage arrays 332 located at the stacked memory 300, at a register file, a CAM, cache, or other storage element at a logic die 122 (FIGS. 1 and 2), in a non-volatile memory 333, or a combination thereof. The coherency manager 134 further includes coherency logic 334 having access to the storage array 332, and which is configured to perform cache coherency operations using the coherency metadata stored therein. The stored coherency metadata may include, for example, coherency status information for corresponding memory blocks for the caches of the external devices so as to enable the coherency manager 134 to implement a directory-based cache coherency policy. Another example of the stored coherency metadata is metadata representing recent coherency updates so as to enable the coherency manager 134 to implement a snoop filter. Further, as described in greater detail herein, the coherency manager 134 may maintain and use a cache access history to predict future cache accesses and to set a coherency configuration in anticipation of these predicted memory accesses, and thus the coherency metadata can include information representing this cache access history, as well as cache configuration information implemented on the basis of the predicted cache accesses.

As described in greater detail herein, the implemented cache coherency protocol may rely on probes communicated among the devices of the processing system 100. These probes can include, for example, snoop requests, snoop responses, and the like. To illustrate, to determine the status of data stored at particular memory block, one device may issue a probe 336 to one or more other devices to determine the statuses of the corresponding block in their local caches. Each device receiving the probe 336 may assess its local cache hierarchy to determine whether a version of the data is locally cached, and if so, reply with a probe response 338 indicating the status of the data in the local cache and, if modified by the device, a copy of the data so modified. In some embodiments, the probe signaling communicated among the devices of the processing system 100 is transmitted via the same interconnect 106 used to facilitate general memory transactions. In some embodiments, the probe signaling is communicated among the devices as out-of-band signals using one or more separate interconnects, such as a shared bus dedicated to probe signaling or via point-to-point connections dedicated to probe signaling.

Figure 4:
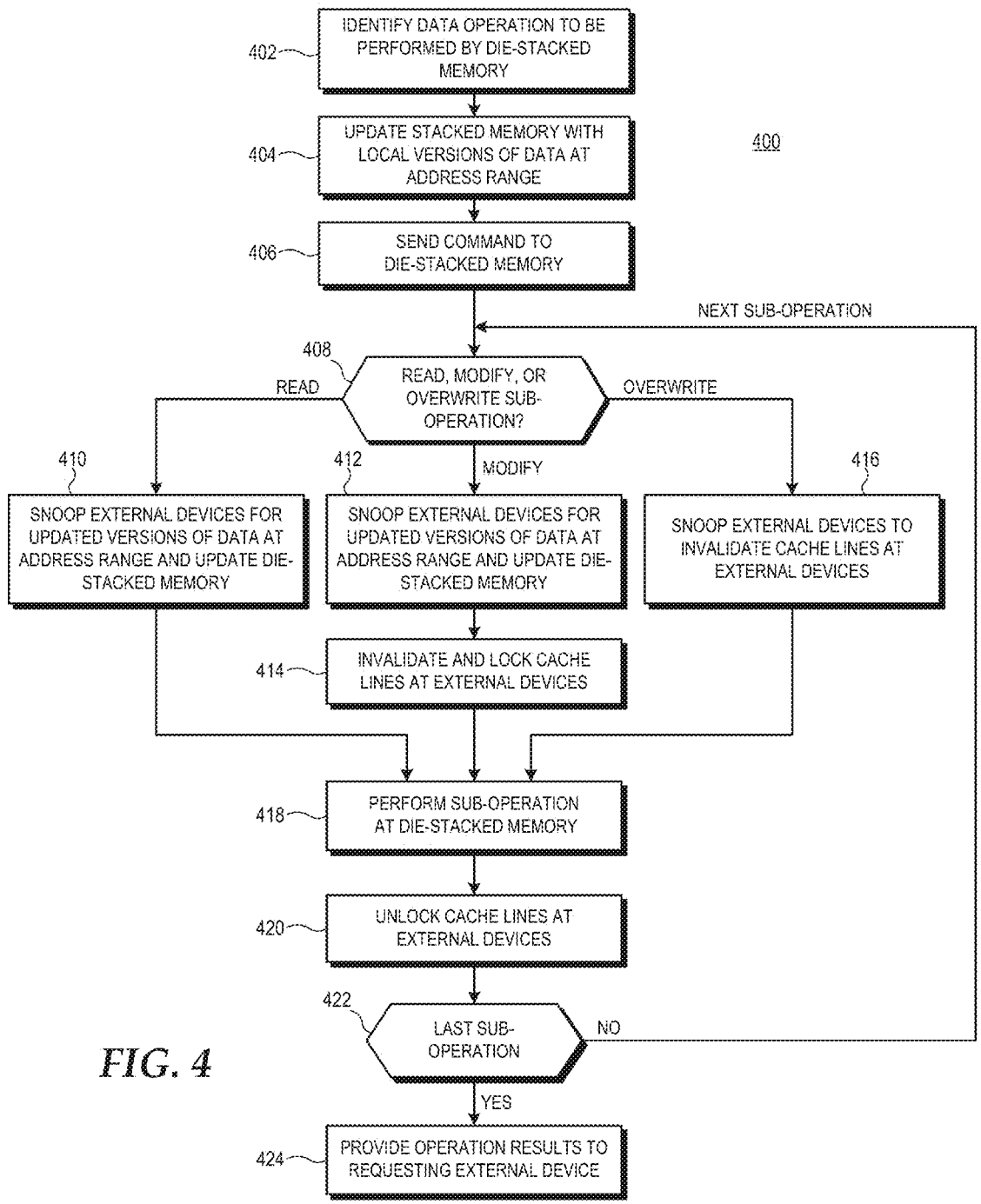
FIG. 4 is a flow diagram illustrating an example method of implementing a snoop-based cache coherency protocol at a coherency manager of a die-stacked memory device in accordance with some embodiments.

FIG. 4 illustrates a method 400 for performing data manipulation operations at the die-stacked memory device 102 using coherent data in accordance with some embodiments. For ease of illustration, the method 400 is described in the example context of the implementation of the processing system depicted in FIG. 3. The method 400 initiates at block 402 whereupon a processor or other external device identifies a data manipulation operation to be performed at the die-stacked memory device 102. For example, in the course of executing a program, the processor may initiate execution of an instruction or sub-routine that triggers the outsourcing of a data manipulation operation to the die-stacked memory device 102 for execution. Such data manipulation operations typically have the characteristic of being able to leverage the co-location of the logic dies 122 and the stacked memory dies 120 so as to reduce or eliminate the number of memory access transactions, or reduce the latency of such memory access transactions, that would otherwise need to be conducted between the die-stacked memory device 102 and the requesting external device over the interconnect 106. Encryption operations, gather/scatter operations, search operations, and pointer-chasing operations are examples of such operations.

In anticipation of instructing the die-stacked memory device 102 to perform the data manipulation operation, at block 404 the requesting external device writes any local modified versions of the cache lines associated with the one or more memory blocks expected to be involved with the data manipulation operation back to the die-stacked memory device 102. With the die-stacked memory device 102 updated, at block 406 the requesting external device transmits an operation command 320 (FIG. 3) to the die-stacked memory device 102. In other embodiments, the data manipulation operation is triggered at the die-stacked memory device 102 independent of an operation command 320. For example, the die-stacked memory device 102 may implement a garbage collection process that periodically is performed for the stacked memory 300 (FIG. 3), and thus an internal timer or other internal trigger may be used to initiate the garbage collection process.

A data manipulation operation may have one or more sub-operations. For example, a search-and-replace operation may have a search sub-operation and a replace sub-operation. Each sub-operation may be broadly categorized into one of three categories: read sub-operations; modify sub-operations; and overwrite (or erase) sub-operations. Read sub-operations are operations in which the operation logic 310 reads a well-defined memory range without modifying the data. Search operations and pointer-chasing operations are examples of such read sub-operations. Modify sub-operations are operations in which the operation logic 310 modifies the data stored at a well-defined memory range such that the resulting data is based on the originally-stored data. An encryption operation is an example of a modify sub-operation. Overwrite sub-operations are operations in which the operation logic 310 overwrites the data stored at a well-defined memory range such that the resulting data is not based on the originally-stored data. An erase operation and an operation setting all memory locations in a specified range to a specified value are examples of such overwrite sub-operations.

In response to receiving the operation command 320 (or in response to an internal trigger), at block 408 the coherency manager 134 determines which coherency operations to implement for each sub-operation of the data manipulation operation identified by the operation command 320, whereby the coherency operations so implemented depend on whether the sub-operation represents a read sub-operation, a modify sub-operation, or an overwrite sub-operation.

A read sub-operation typically is expected to operate on coherent data. Accordingly, in the event that the next sub-operation of the data manipulation operation to be performed is a read sub-operation, at block 410 the coherency manager 134 ensures coherency for the memory address range associated with the read sub-operation by sending probes to the external devices in the form of snoop commands for the cache lines associated with the specified memory address range. In response to receiving the corresponding snoop command, the cache controller at each external device determines whether any of its cache lines that correspond to the specified address range have modified data. If so, the cache controller replies to the snoop command by copying back the modified cache lines to the stacked memory 300 of the die-stacked memory device 102. The coherency manager 134 further locks the identified cache lines at the external devices by sending a lock command, either as part of the snoop command to obtain the modified copies of the cache lines, or via a separate lock command transmitted to the external devices. In response to the corresponding lock command, the cache controllers at the external devices lock the identified cache lines so as to prevent the external devices from accessing the corresponding data until the read sub-operation has completed. At this point, the die-stacked memory device 102 and the external devices are cache coherent for purposes of the read operation.

Referring back to block 408, modify sub-operations, like read sub-operations, typically are expected to operate on the most recent version of data stored at the specified memory address range associated with the modify sub-operation. Accordingly, if the current sub-operation to be performed is a modify sub-operation, at block 412 the coherency manager 134 issues a snoop command to instruct the external devices to write back to the stacked memory 300 of the die-stacked memory device 102 any cache lines having modified data for the specified memory address range, thereby updating the die-stacked memory device 102 to store the most recent version of data for the specified memory address range. Unlike read sub-operations, however, modify sub-operations modify the contents of the specified memory address range, and thus the corresponding cache lines at the caches of the external devices will no longer be coherent (that is, they will no longer store the most recent version of the data). Accordingly, at block 414 the coherency manager 134 also issues a snoop command to the external devices to both lock and invalidate the specified cache lines, in response to which the cache controllers at the external devices lock the cache lines and mark the cache lines as invalid so as to reflect that the caches of the external devices do not store up-to-date versions of the data. At this point, the die-stacked memory device 102 and the external devices are coherent for purposes of the modify sub-operation.

Referring again to block 408, overwrite sub-operations are independent of the data stored at the specified memory address range, and thus it is not necessary to ensure cache coherence for the specified memory address range at the die-stacked memory device 102 before initiating a overwrite sub-operation. Accordingly, if the current sub-operation to be performed is an overwrite sub-operation, at block 416 the coherency manager 134 refrains from issuing a snoop command to update the stacked memory 300 of the die-stacked memory device 102 while issuing a snoop command to the external devices to instruct the corresponding cache controllers to invalidate the corresponding cache lines to reflect that the caches of the external devices no longer store the most recent version of the contents of the specified address range. At this point, the die-stacked memory device 102 and the external devices are cache coherent for purposes of the overwrite sub-operation.

It will be appreciated that the snoop signaling used to achieve cache coherence can consume significant bandwidth of the interconnect 106. Accordingly, to reduce the amount of snoop traffic, the coherency manager 134 can implement one or more probe filters. Such probe filters typically utilize coherency metadata (stored in, for example, the storage array 332 of FIG. 3) that represents the known states of various blocks and inhibits certain snoop traffic based on these known states. For example, U.S. Pat. No. 6,973,543 describes a probe filter that records the addresses of blocks which are known to be cached in a non-exclusive state (or known to be not cached at all) and thus may suppress or prevent read commands to a block that has been so recorded. Other types of probe filters or combinations of probe filters may be used by the coherency manager 134 to reduce snoop traffic in this way.

When the die-stacked memory device 102 and the external devices are cache coherent for purposes of the identified sub-operation of the data manipulation operation, at block 418 the coherency module 134 signals this state to the operation logic 310 and, in response, the operation logic 310 performs the sub-operation. With the completion of the current sub-operation, the die-stacked memory device 102 no longer requires exclusive access to the specified memory address range and thus at block 420 the coherency manager 134 issues a snoop command to unlock the corresponding cache lines at the external devices. In situations whereby the cache lines were invalidated, the cache managers at the external devices may respond to the removal of the cache lock by issuing a snoop request to the die-stacked memory device 102 or by initiating a memory access request to the die-stacked memory device 102 in order to obtain the most recent version of the contents of the cache lines resulting from the data manipulation operation.

At block 422, the coherency module 134 determines whether there is another sub-operation to be performed for the data manipulation operation. If so, the process of blocks 408-422 is repeated for the next sub-operation. Otherwise, if all sub-operations have been performed, at block 424 the data manipulation operation is identified as completed and the operation logic 310 sends a response 322 to the requesting external device to confirm completion of the requested data manipulation operation and to provide the results of the data manipulation operation, if any, to the requesting external device.

Figure 5:
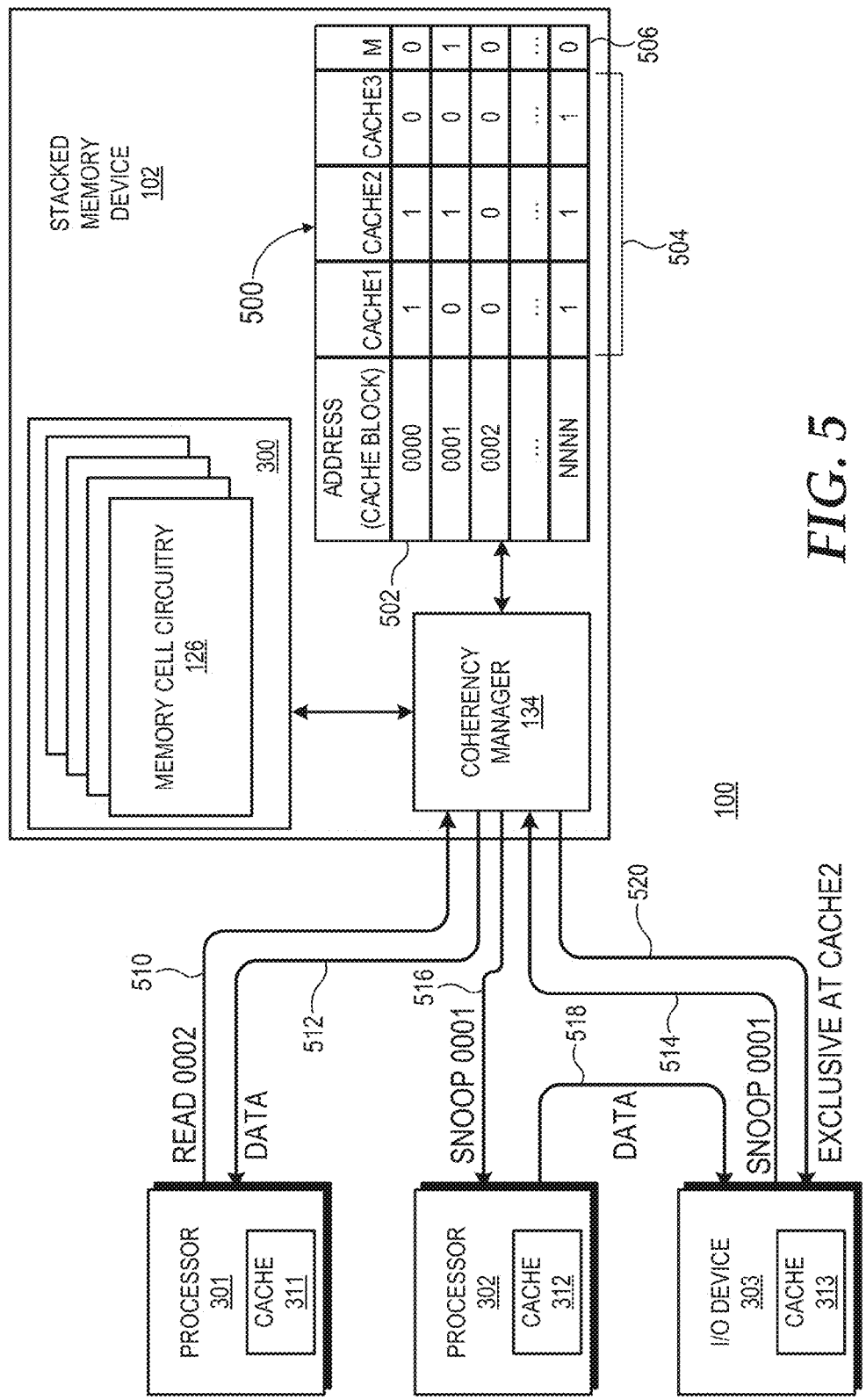
FIG. 5 is a diagram illustrating an example method of implementing a directory-based cache coherency protocol at a coherency manager of a die-stacked memory device in accordance with some embodiments.

FIG. 5 illustrates an example configuration of the die-stacked memory device 102 to support a directory-based cache coherency protocol in accordance with some embodiments. In the illustrated example, the coherency manager 134 operates as a centralized control point for system-wide coherency operations. In particular, the coherency manager 134 can leverage the relatively large amount of storage capacity provided by the stacked memory 300 of the die-stacked memory device 102 to maintain a coherency directory 500 in the storage array 332 (FIG. 3) that contains coherency information for corresponding addresses of the stacked memory 300.

As illustrated in FIG. 5, this coherency information can include a plurality of entries 502, each entry 502 associated with a corresponding memory block (e.g., a cache line) and fields storing indicators of the location and state of cached copies of the corresponding memory block. The location information can be implemented as, for example, a location field 504 storing a bit vector, whereby each bit position of the bit vector represents a cache of a corresponding external device and whereby a bit value of "1" in a given bit position indicates that the cache line is cached at the external device associated with the bit position, and a bit value of "0" indicates that the cache line is not cached at that external device. The state information may be implemented as, for example, a modified field 506 storing a modified bit M, whereby a value of "1" for the modified bit M indicates the contents of the corresponding cache line have been modified at an external device, and a value of "0" indicates the contents of the corresponding cache line have not been modified. Although FIG. 5 illustrates the coherency information of the coherency directory 500 as a contiguous block of information, in some embodiments the coherency information represented in the coherency directory 500 can be distributed with the corresponding data in the stacked memory 300. For example, each entry 502 could be stored with the corresponding memory block in the stacked memory 300. Moreover, although FIG. 5 illustrates one example configuration of a coherency directory, any of a variety of well-known coherency directory configurations may be implemented using the guidelines provided herein.

As the coherency manager 134 operates as the centralized control point, the coherency manager 134 monitors the snoop traffic conducted among the devices of the processing system 100 to identify snoops directed to memory blocks maintained in the coherency directory 500. Upon receiving a snoop request for the contents of a given memory block, the coherency manager 134 accesses the entry 502 of the coherency directory 500 associated with the memory block and responds to the requesting external device with information regarding the status of the memory block in other caches in the processing system 100.

Moreover, if the coherency manager 134 determines from the coherency directory 500 that the stacked memory 300 stores a coherent version of the memory block (that is, a modified version is not cached elsewhere), the coherency manager 134 accesses the memory block and provides the contents of the memory block to the requesting external device. To illustrate, in response to a snoop request 510 from the processor 301 for the memory block at address 0002, the coherency manager 134 accesses the corresponding entry 502 of the coherency directory 500 and, based on the modified bit M being set to "0" determines that the stacked memory 300 stores the most-recent version of the contents of the memory block at address 0002. Accordingly, the coherency manager 134 accesses the memory block at address 0002 and responds to the snoop request 510 with a response 512 that includes the accessed contents at the memory block.

If the coherency manager 134 determines from the coherency directory 500 that the stacked memory 300 is not coherent for the memory block (that is, modified versions of the involved memory blocks are cached elsewhere), in some embodiments the coherency manager 134 initiates a snoop request to the external device caching the modified version of a memory block. For example, in response to a snoop request 514 from the I/O controller 303 for the memory block at address 0001, the coherency manager 134 accesses the corresponding entry 502 of the coherency directory 500 and, based on the modified bit M being set to "1", determines that a modified version of the contents of the memory block are stored in another cache and determines from the location bit vector that the modified version is located at the cache 312 associated with processor 302. In response, the coherency manager 134 sends a snoop request 516 to the processor 302 to initiate the write-back of the modified contents of the corresponding cache line to the stacked memory 300 of the die-stacked memory device 102. Upon receipt, the coherency manager 134 forwards the modified contents of the memory block as a response 518 to the I/O controller 303. In other embodiments, the coherency manager 134 responds to the snoop request 516 with a response 520 provided to the requesting external device and including an indication of the location of the cache storing the modified version of the memory block (the cache 312 in this example), and the requesting external device then initiates a snoop to that location in order to update its local cache line.

Figure 6:
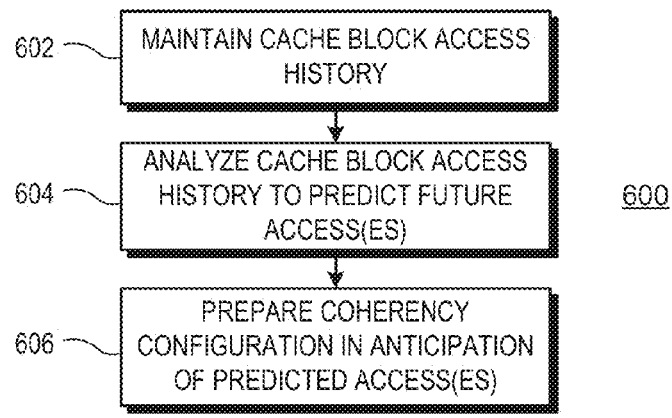
FIG. 6 is a flow diagram illustrating an example method of setting a coherency configuration by a coherency manager at a die-stacked memory device based on predicted cache access patterns in accordance with some embodiments.

The relative size of the stacked memory 300 may allow the coherency manager 134 to maintain more detailed coherency metadata and therefore better track the coherence state of memory blocks among the external devices of the processing system 100. Moreover, the relatively large size of the stacked memory 300 and tight integration between the memory dies 120 implementing the stacked memory 300 and the logic dies 122 in the die-stacked memory device 102 can be leveraged by the coherency manager 134 to support cache coherence and improved processing efficiency by performing proactive cache coherence operations in anticipation of the future needs of the processing system 100. These proactive cache coherence operations may be performed by the coherency manager 134 in addition to, or instead of, the reactive coherency operations described above. That is, the logic implemented at the logic dies 122 (FIG. 1) of the die-stacked memory device 102 can perform operations that support the processing of coherence operations without performing any additional modification to the data. FIG. 6 illustrates an example method 600 for providing this proactive cache coherency support in accordance with some embodiments. The method 600 is described in the example context of the processing system of FIG. 3.

At block 602, the coherency manager 134 maintains a memory block access history in the storage array 332, whereby the cache block access history contains metadata that describes a history and context of previous access to memory blocks maintained in the stacked memory 300 of the die-stacked memory device 102. For example, the metadata could describe the last N access requests to a corresponding memory block, with the description of each access request including, for example, an identifier of the requesting device, the time of the access request, a result or type of access request (e.g., read access, write access, etc.), and the like. Thus, for each access to a memory block the coherency manager 134 updates the memory block access history to reflect the access to the corresponding memory block.

At block 604, the coherency manager 134 analyzes the memory block access history to predict future accesses based on patterns or other information gleaned from the memory block access, and at block 606, the coherency manager 134 predicts future memory block accesses based on the analysis at block 604 and then prepares a coherency configuration in anticipation of the predicted future memory block accesses. To illustrate, the memory block access history indicates that the owner permissions for a memory block have migrated between the external devices in a particular pattern, the coherency manager 134 can use this observed pattern to predict the next owner of the memory block and then migrate the exclusive permissions for the memory block to the predicted next owner. As another example, if the coherency manager 134 detects a pattern of reads following each write to a memory block, the coherency manager 134 can migrate the contents of the memory block to a shared cache (e.g., a shared L3 cache) in response to a write to the memory block, thereby facilitating quicker access to the contents via the shared cache in anticipation of the sequence of reads predicted to follow the write. The amount of memory block access history information that can be stored in the stacked memory 300 allows the coherency manager 134 to develop more precise predictors of sharing and access patterns and thus enable more effective proactive coherency configurations, which can include predicting the number of reads that occur between writes (and thus enabling the coherency manager 134 to suppress snoop requests between writes), predicting the device to request a memory block next (and thus enabling the coherency manager 134 to proactively transfer ownership of the memory block before the next request is received), predicting when memory blocks are "dead" or no longer shared or in use (and thereby permitting the cache lines corresponding to the memory blocks to be evicted), and the like. By preemptively making these predictions, the coherency manager 134 can move many coherency operations off the critical path that is the interconnect 106.

In some embodiments, the apparatus and techniques described above are implemented in a system comprising one or more integrated circuit (IC) devices (also referred to as integrated circuit packages or microchips), such as the die-stacked memory device 102 described above with reference to FIGS. 1-6. Electronic design automation (EDA) and computer aided design (CAD) software tools may be used in the design and fabrication of these IC devices. These design tools typically are represented as one or more software programs. The one or more software programs comprise code executable by a computer system to manipulate the computer system to operate on code representative of circuitry of one or more IC devices so as to perform at least a portion of a process to design or adapt a manufacturing system to fabricate the circuitry. This code can include instructions, data, or a combination of instructions and data. The software instructions representing a design tool or fabrication tool typically are stored in a computer readable storage medium accessible to the computing system. Likewise, the code representative of one or more phases of the design or fabrication of an IC device may be stored in and accessed from the same computer readable storage medium or a different computer readable storage medium.

A computer readable storage medium may include any storage medium, or combination of storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

Figure 7:
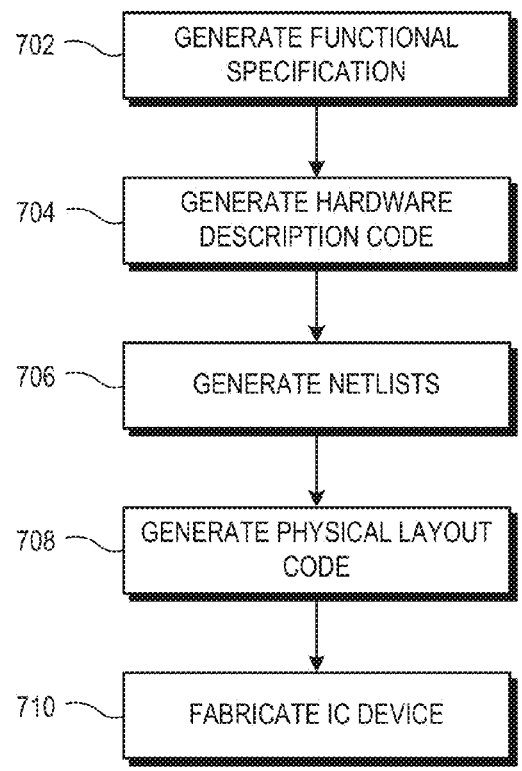
FIG. 7 is a flow diagram illustrating a method for designing and fabricating an integrated circuit (IC) package implementing a die-stacked memory device in accordance with some embodiments.

FIG. 7 is a flow diagram illustrating an example method 700 for the design and fabrication of an IC device implementing one or more aspects. As noted above, the code generated for each of the following processes is stored or otherwise embodied in computer readable storage media for access and use by the corresponding design tool or fabrication tool.

At block 702 a functional specification for the IC device is generated. The functional specification (often referred to as a micro architecture specification (i)) may be represented by any of a variety of programming languages or modeling languages, including C, C++, SystemC, Simulink™, or MATLAB™.

At block 704, the functional specification is used to generate hardware description code representative of the hardware of the IC device. In at some embodiments, the hardware description code is represented using at least one Hardware Description Language (HDL), which comprises any of a variety of computer languages, specification languages, or modeling languages for the formal description and design of the circuits of the IC device. The generated HDL code typically represents the operation of the circuits of the IC device, the design and organization of the circuits, and tests to verify correct operation of the IC device through simulation. Examples of HDL include Analog HDL (AHDL), Verilog HDL, SystemVerilog HDL, and VHDL. For IC devices implementing synchronized digital circuits, the hardware descriptor code may include register transfer level (RTL) code to provide an abstract representation of the operations of the synchronous digital circuits. For other types of circuitry, the hardware descriptor code may include behavior-level code to provide an abstract representation of the circuitry's operation. The HDL model represented by the hardware description code typically is subjected to one or more rounds of simulation and debugging to pass design verification.

After verifying the design represented by the hardware description code, at block 706 a synthesis tool is used to synthesize the hardware description code to generate code representing or defining an initial physical implementation of the circuitry of the IC device. In some embodiments, the synthesis tool generates one or more netlists comprising circuit device instances (e.g., gates, transistors, resistors, capacitors, inductors, diodes, etc.) and the nets, or connections, between the circuit device instances. Alternatively, all or a portion of a netlist can be generated manually without the use of a synthesis tool. As with the hardware description code, the netlists may be subjected to one or more test and verification processes before a final set of one or more netlists is generated.

Alternatively, a schematic editor tool can be used to draft a schematic of circuitry of the IC device and a schematic capture tool then may be used to capture the resulting circuit diagram and to generate one or more netlists (stored on a computer readable media) representing the components and connectivity of the circuit diagram. The captured circuit diagram may then be subjected to one or more rounds of simulation for testing and verification.

At block 708, one or more EDA tools use the netlists produced at block 706 to generate code representing the physical layout of the circuitry of the IC device. This process can include, for example, a placement tool using the netlists to determine or fix the location of each element of the circuitry of the IC device. Further, a routing tool builds on the placement process to add and route the wires needed to connect the circuit elements in accordance with the netlist(s). The resulting code represents a three-dimensional model of the IC device. The code may be represented in a database file format, such as, for example, the Graphic Database System II (GDSII) format. Data in this format typically represents geometric shapes, text labels, and other information about the circuit layout in hierarchical form.

At block 710, the physical layout code (e.g., GDSII code) is provided to a manufacturing facility, which uses the physical layout code to configure or otherwise adapt fabrication tools of the manufacturing facility (e.g., through mask works) to fabricate the IC device. That is, the physical layout code may be programmed into one or more computer systems, which may then control, in whole or part, the operation of the tools of the manufacturing facility or the manufacturing operations performed therein.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. An integrated circuit (IC) package comprising:
a die-stacked memory device comprising:
a set of one or more stacked memory dies implementing memory cell circuitry; and
a set of one or more logic dies electrically coupled to the memory cell circuitry, the set of one or more logic dies comprising a coherency manager and a memory interface, the memory interface coupled to the coherency manager and coupleable to a device external to the die-stacked memory device, and the coherency manager to maintain coherency for memory addresses mapped to the set of one or more stacked memory dies.

2. The IC package of claim 1, wherein:
the set of one or more logic dies further comprises logic to perform a data manipulation operation using data stored at the set of one or more stacked memory dies in response to a command from a device external to the die-stacked memory device; and
the coherency manager is to probe caches of one or more devices external to the die-stacked memory device responsive to the command.

3. The IC package of claim 2, wherein the data manipulation operation comprises a read sub-operation to access data stored at the set of one or more stacked memory dies without modifying the data and the coherency manager is to probe the caches to replace the data stored at the set of one or more stacked memory dies with the most recent modified cacheable version of the data stored at the caches.

4. The IC package of claim 2, wherein the data manipulation operation comprises a modify sub-operation to modify data stored at the set of one or more stacked memory dies and the coherency manager is to probe the caches to replace the data stored at the set of one or more stacked memory dies with the most recent modified cacheable version of the data stored at the caches and to invalidate any cacheable versions of the data stored at the caches.

5. The IC package of claim 2, wherein the data manipulation operation comprises an overwrite sub-operation to overwrite data stored at the set of one or more stacked memory dies and the coherency manager is to probe the caches to invalidate any cacheable versions of the data stored at the caches.

6. The IC package of claim 2, further comprising:
a storage array to store information representing a history of probes issued by the coherency manager; and
wherein the coherency manager comprises a probe filter to filter probes using the storage array.

7. The IC package of claim 1, further comprising:
a storage array to store a coherency directory identifying status information for memory blocks of the set of one or more stacked memory dies, the status information comprising cached location and state information for each memory block; and
the coherency manager is to update the coherency directory responsive to snoop traffic from one or more devices external to the die-stacked memory device.

8. The IC package of claim 7, wherein, in response to a probe directed to a specified memory address from a device external to the die-stacked memory device, the coherency manager is to access the coherency directory and provide a status of the memory block associated with the memory address to the external device.

9. The IC package of claim 8, wherein the coherency manager further is to provide contents stored at the memory block to the external device responsive to the probe and responsive to the memory block being up-to-date at the set of one or more stacked memory dies.

10. The IC package of claim 1, further comprising:
a storage array to store information representing a history of cache accesses to the set of one or more stacked memory dies; and
wherein the coherency manager is to predict a next access to a memory block based on an access pattern represented by the history of cache accesses, and the coherency manager further is to set a coherency configuration for the memory block responsive to the predicted next access.

11. The IC package of claim 10, wherein the coherency configuration comprises at least one of: providing exclusive permission to a device predicted to issue the predicted next access; and storing data stored at a memory block predicted to be accessed by the predicted next access to a cache shared with a device predicted to issue the next access.

12. The IC package of claim 1, wherein the set of one or more stacked memory dies and the set of one or more logic dies are disposed in a stacked configuration whereby the memory interface is connected to the stacked memory dies via a set of through silicon vias.

13. The IC package of claim 1, wherein the set of one or more stacked memory dies and the set of one or more logic dies are disposed in a side-split arrangement whereby the memory interface is connected to the stacked memory dies via an interposer.

14. A method comprising:
providing an integrated circuit (IC) comprising a set of one or more stacked memory dies comprising memory cell circuitry and comprising a set of one or more logic dies electrically coupled to the set of one or more stacked memory dies, the set of one or more logic dies comprising a coherency manager coupled to the memory cell circuitry of the set of one or more stacked memory dies and comprising a memory interface coupled to the coherency manager and coupled to one or more external devices;
operating the memory interface to perform memory accesses for the device; and
operating the coherency manager to maintain coherency for memory addresses mapped to the set of one or more stacked memory dies.

15. The method of claim 14, wherein:
operating the coherency manager to maintain coherency comprises operating the coherency manager to probe caches of one or more of the external devices responsive to a command from an external device; and further comprising:
operating logic at the set of one or more logic dies to perform a data manipulation operation using data stored at the set of one or more stacked memory dies in response to the command from an external device and in response to completing the probing of the caches.

16. The method of claim 15, wherein:
the data manipulation operation comprises a read sub-operation to access data stored at the set of one or more stacked memory dies without modifying the data; and
operating the coherency manager to probe the caches comprises operating the coherency manager to probe the caches to replace the data stored at the set of one or more stacked memory dies with the most recent modified cacheable version of the data stored at the caches.

17. The method of claim 16, wherein:
the data manipulation operation comprises a modify sub-operation to modify data stored at the set of one or more stacked memory dies; and
operating the coherency manager to probe the caches comprises operating the coherency manager to probe the caches to replace the data stored at the set of one or more stacked memory dies with the most recent modified cacheable version of the data stored at the caches and to invalidate any cacheable versions of the data stored at the caches.

18. The method of claim 16, wherein:
the data manipulation operation comprises an overwrite sub-operation to overwrite data stored at the set of one or more stacked memory dies; and
operating the coherency manager to probe the caches comprises operating the coherency manager to probe the caches to invalidate any cacheable versions of the data stored at the caches.

19. The method of claim 14 wherein operating the coherency manager to maintain coherency comprises:
operating the coherency manager to maintain a coherency directory identifying status information for memory blocks of the set of one or more stacked memory dies, the status information comprising cached location and state information for each memory block; and
operating the coherency manager to update the coherency directory responsive to snoop traffic from one or more external devices.

20. The method of claim 14 wherein operating the coherency manager to maintain coherency comprises:
operating the coherency manager to maintain information representing a history of cache accesses to the set of one or more stacked memory dies; and
operating the coherency manager to predict a next access to a memory block based on an access pattern represented by the history of cache accesses, and the coherency manager further is to set a coherency configuration for the memory block responsive to the predicted next access.

21. A non-transitory computer readable storage medium storing code that is operable to manipulate at least one computer system to perform a portion of a process to fabricate an integrated circuit (IC) package, the IC package comprising:
   a die-stacked memory device comprising:
   a set of one or more stacked memory dies implementing memory cell circuitry; and
   a set of one or more logic dies electrically coupled to the memory cell circuitry, the set of one or more logic dies comprising a coherency manager and a memory interface, the memory interface coupled to the coherency manager and coupleable to a device external to the die-stacked memory device, and the coherency manager to maintain coherency for memory addresses mapped to the set of one or more stacked memory dies.

22. The non-transitory computer readable storage medium of claim 21, wherein:
   the set of one or more logic dies further comprises logic to perform a data manipulation operation using data stored at the set of one or more stacked memory dies in response to a command from an external device; and
   the coherency manager is to probe caches of one or more external devices responsive to the command.

23. The non-transitory computer readable storage medium of claim 21, wherein the IC package further comprises:
   a storage array to store a coherency directory identifying status information for memory blocks of the set of one or more stacked memory dies, the status information comprising cached location and state information for each memory block; and
   the coherency manager is to update the coherency directory responsive to snoop traffic from one or more external devices.

24. The non-transitory computer readable storage medium of claim 21, wherein the IC package further comprises:
   a storage array to store information representing a history of cache accesses to the set of one or more stacked memory dies; and
   wherein the coherency manager is to predict a next access to a memory block based on an access pattern represented by the history of cache accesses, and the coherency manager further is to set a coherency configuration for the memory block responsive to the predicted next access.

25. The non-transitory computer readable storage medium of claim 21, wherein the set of one or more stacked memory dies and the set of one or more logic dies are disposed in a stacked configuration whereby the memory interface is connected to the stacked memory dies via a set of through silicon vias.

26. The non-transitory computer readable storage medium of claim 21, wherein the set of one or more stacked memory dies and the set of one or more logic dies are disposed in a side-split arrangement whereby the memory interface is connected to the stacked memory dies via an interposer.

* * * * *